(12) United States Patent
Murakoshi et al.

(10) Patent No.: US 11,367,694 B2
(45) Date of Patent: Jun. 21, 2022

(54) SEMICONDUCTOR INTEGRATED CIRCUIT AND WITHSTAND VOLTAGE TEST METHOD

(71) Applicant: SHENZHEN TOREY MICROELECTRONIC TECHNOLOGY CO. LTD., Shenzhen (CN)

(72) Inventors: Kenichi Murakoshi, Sakai (JP); Kimitsugu Yoshikawa, Sakai (JP); Tatsuya Ishida, Sakai (JP)

(73) Assignee: SHENZHEN TOREY MICROELECTRONIC TECHNOLOGY CO. LTD., Shenzhen (CN)

( * ) Notice: Subject to any disclaimer, the term of this patent is extended or adjusted under 35 U.S.C. 154(b) by 357 days.

(21) Appl. No.: 16/794,639

(22) Filed: Feb. 19, 2020

(65) Prior Publication Data

US 2020/0266157 A1 Aug. 20, 2020

Related U.S. Application Data

(60) Provisional application No. 62/808,004, filed on Feb. 20, 2019.

(51) Int. Cl.
| | |
|---|---|
| *H01L 23/58* | (2006.01) |
| *H01L 21/82* | (2006.01) |
| *H01L 23/522* | (2006.01) |
| *G01R 31/28* | (2006.01) |
| *H01L 23/31* | (2006.01) |
| *H01L 23/00* | (2006.01) |

(52) U.S. Cl.
CPC ........ *H01L 23/585* (2013.01); *G01R 31/2856* (2013.01); *G01R 31/2884* (2013.01); *H01L 21/82* (2013.01); *H01L 23/3171* (2013.01); *H01L 23/522* (2013.01); *H01L 23/562* (2013.01)

(58) Field of Classification Search
CPC ............ G01R 21/2884; G01R 31/2856; H01L 23/585
See application file for complete search history.

(56) References Cited

U.S. PATENT DOCUMENTS

2008/0191205 A1\* 8/2008 Tsai ......................... H01L 22/34
257/E23.001

FOREIGN PATENT DOCUMENTS

| JP | H05-166911 A | 7/1993 |
| JP | H06-085025 A | 3/1994 |

\* cited by examiner

*Primary Examiner* — Alia Sabur
(74) *Attorney, Agent, or Firm* — ScienBiziP, P.C.

(57) ABSTRACT

A voltage application region and a voltage applying pad form withstand voltage measuring wiring lines insulated from each other and different from each other by connecting a seal ring and a relay region through a via, and the withstand voltage measuring wiring lines different from each other are configured to apply a voltage between insulated seal rings provided on wiring layers adjacent to each other by applying a voltage between the voltage application region and the voltage applying pad.

5 Claims, 5 Drawing Sheets

SEMICONDUCTOR INTEGRATED CIRCUIT AND WITHSTAND VOLTAGE TEST METHOD

TECHNICAL FIELD

The present invention relates to a structure of a semiconductor integrated circuit, and more particularly to, a semiconductor integrated circuit having a structure capable of performing withstand voltage inspection between wiring layers and a withstand voltage test method thereof.

BACKGROUND ART

Recently, miniaturization in a semiconductor process has led to reduction in size and low cost of an electric apparatus. However, on the other hand, when the number of transistors to fill up a unit area is increased, the number of wiring lines connecting the transistors is also increased, a space is not sufficient even though a width or an interval between wiring lines is reduced, so that formation of a multilayer wiring line is required. Currently, the formation of a multilayer wiring line has reached more than 10 layers.

In accordance with the formation of a multilayer wiring line, the possibility of failure in the semiconductor integrated circuit due to an insulation withstand voltage defect between the wiring layers also becomes high. Variations in thickness of interlayer film occurs in a wafer plane and also in the semiconductor integrated circuit due to manufacturing variation or a loading effect. In some cases, the interlayer film thickness may be small as to deviate from a control value. When such a high electric field is applied to an area having the smaller interlayer film thickness than assumed, interlayer dielectric breakdown may occur even if a potential difference between layers is within a range of specification.

The semiconductor integrated circuit does not operate normally due to the interlayer dielectric breakdown and latch-up caused by potential inversion occurs as for the worst case, which may cause smoke and ignition. For this reason, it is required to screen products that the interlayer dielectric breakdown may occur by performing withstand voltage inspection on the interlayer insulating film between wiring layers inside of the semiconductor integrated circuit after the semiconductor integrated circuit is manufactured.

For example, a technique disclosed in PTL 1 is that a wiring layer dedicated to an interlayer withstand voltage test is formed on a whole semiconductor integrated circuit formation region in a single wafer, such that the interlayer withstand voltage test of the semiconductor integrated circuit can be performed for every formation region.

In addition, a technique disclosed in PTL 2 is that a semiconductor device having a multilayer wiring structure is provided with a region for detecting an interlayer withstand voltage defect (monitor element) in a region outside an operation circuit region on a chip, so that it is possible to perform an interlayer withstand voltage test of the semiconductor device.

CITATION LIST

Patent Literature

[PTL 1] Japanese Unexamined Patent Application Publication No. 5-166911
[PTL 2] Japanese Unexamined Patent Application Publication No. 6-85025

SUMMARY OF INVENTION

Technical Problem

However, in the technique disclosed in PTL 1, since the wiring layer dedicated to the interlayer withstand voltage test is provided only a part of the semiconductor integrated circuit, it has a problem in a structure in which the insulation withstand voltage defect caused by thinning of interlayer film due to variations in thickness of interlayer film of the semiconductor integrated circuit is not easy to be detected, and which is not suitable for the withstand voltage inspection on interlayer insulating film.

Further, in the technique disclosed in PTL 2, it is not easy to individually perform the detection of the insulation withstand voltage defect on each interlayer film in the multilayer wiring structure, which leads to a problem in structure that is not suitable for the withstand voltage inspection on the interlayer insulating film.

In order to solve the above-described problems, an object of an embodiment of the present invention is to implement a semiconductor integrated circuit or the like having a structure that is suitable for withstand voltage inspection on an interlayer insulating film.

Solution to Problem (1) According to an embodiment of the present invention, there is provided a semiconductor integrated circuit including: a chip formation region having a laminated structure in which a plurality of wiring layers are laminated; a plurality of seal rings disposed to surround an outside of the chip formation region, having an identical laminated structure with the chip formation region, and formed of metal wiring; a plurality of relay regions disposed at the outside of the chip formation region, having an identical laminated structure with the chip formation region, and formed of metal wiring; a plurality of vias formed between the wiring layers adjacent to each other; and a voltage application region and a voltage applying pad provided on a wiring layer which is positioned farthest from a substrate and on which the chip formation region and one of the seal rings are formed, among the plurality of wiring layers, in which the voltage application region and the voltage applying pad form withstand voltage measuring wiring lines insulated from each other and different from each other by connecting one of the seal rings and one of the relay regions through one of the vias, and the withstand voltage measuring wiring lines different from each other are configured to apply a voltage between insulated seal rings provided on the wiring layers adjacent to each other by applying a voltage between the voltage application region and the voltage applying pad.

(2) The semiconductor integrated circuit according to an embodiment of the present invention, in addition to the configuration of (1) further includes a second voltage applying pad, in which a thickness of an interlayer insulating film to which a voltage is applied through a withstand voltage measuring wiring line connected to the voltage applying pad and a withstand voltage measuring wiring line connected to the voltage application region, and which is formed between insulated seal rings provided on the wiring layers adjacent to each other, and a thickness of an interlayer insulating film to which a voltage is applied through a withstand voltage measuring wiring line connected to the second voltage applying pad and the withstand voltage measuring wiring line connected to the voltage application region, and which is formed between insulated seal rings provided on the wiring layers adjacent to each other are different from each other.

(3) In the semiconductor integrated circuit according to an embodiment of the present invention, in addition to (1) or (2), in which a seal ring or a relay region formed on a specific wiring layer among the plurality of wiring layers has a protruding region protruding toward the chip formation region as compared with a seal ring or a relay region formed on another wiring layer.

(4) According to an embodiment of the present invention, there is provided a withstand voltage test method in the semiconductor integrated circuit of (1) including: applying a voltage between the voltage application region and the voltage applying pad, and then measuring a leak current flowing between the voltage application region and the voltage applying pad.

(5) According to an embodiment of the present invention, there is provided a withstand voltage test method in the semiconductor integrated circuit of (2) including: applying a voltage between the voltage application region and the voltage applying pad, and then measuring a leak current flowing between the voltage application region and the voltage applying pad; and applying a voltage between the voltage application region and the second voltage applying pad, and then measuring a leak current flowing between the voltage application region and the second voltage applying pad.

Advantageous Effects of Invention

Since the seal ring is widely installed to surround the outside of the semiconductor integrated circuit, a voltage is applied so that a potential difference is generated between the wiring layers of the seal ring, so that it is possible to perform the interlayer withstand voltage test in consideration of variations in thickness of interlayer film in the semiconductor integrated circuit. Accordingly, the semiconductor integrated circuit having a structure that is suitable for withstand voltage inspection on an interlayer insulating film can be implemented.

DESCRIPTION OF EMBODIMENTS

Embodiment 1

Figure 1A:
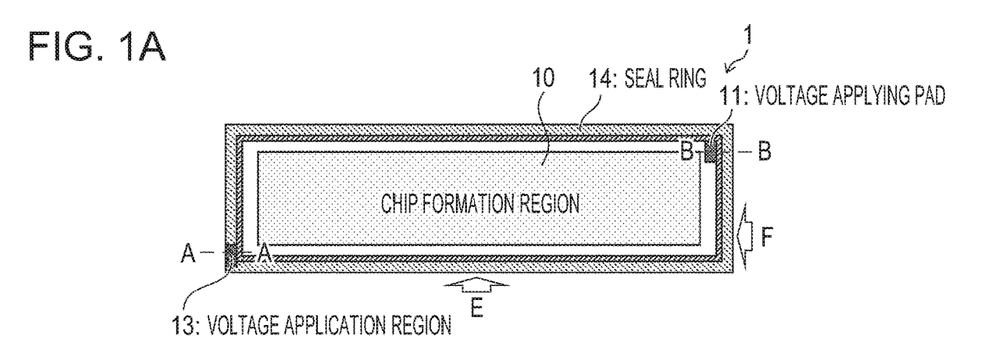
FIG. 1A is a top view of a semiconductor integrated circuit according to Embodiment 1 of the present invention.
Figures 1B, 1C:
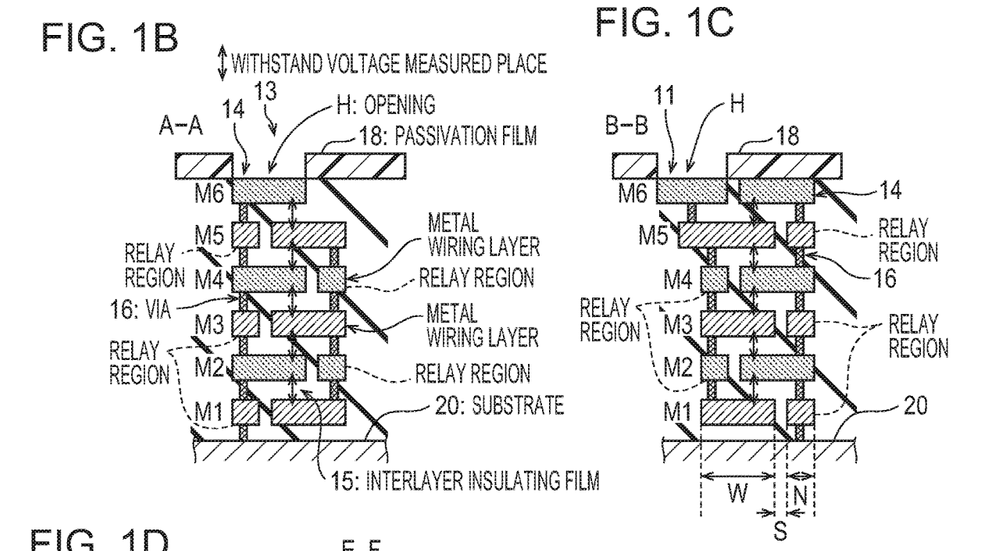
FIG. 1B is a sectional view taken along line A-A of the semiconductor integrated circuit.
FIG. 1C is a sectional view taken along line B-B of the semiconductor integrated circuit.
Figure 1D:
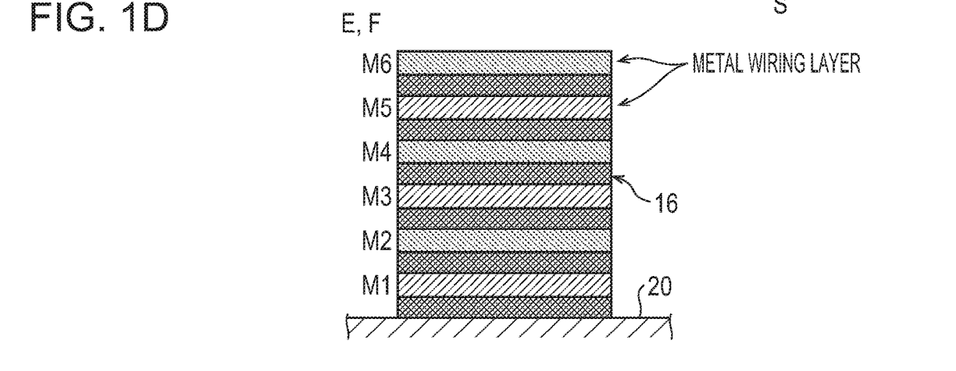
FIG. 1D is a view of E and F side surfaces of the semiconductor integrated circuit.

Hereinafter, a structure of a semiconductor integrated circuit 1 according to Embodiment 1 of the present invention will be described. FIG. 1A is a top view of the semiconductor integrated circuit 1. The semiconductor integrated circuit 1 has a laminated structure in which a plurality of metal wiring layers (wiring layers) are laminated. In addition, the semiconductor integrated circuit 1 has a chip formation region 10, and is provided with a seal ring 14 so as to surround the outside of the chip formation region 10. FIG. 1B is a sectional view taken along line A-A of the semiconductor integrated circuit 1, FIG. 1C is a sectional view taken along line B-B of the semiconductor integrated circuit 1, and FIG. 1D is a view of E and F side surfaces of the semiconductor integrated circuit 1.

The chip formation region 10 is a region formed with a semiconductor integrated circuit (LSI) chip, and has a laminated structure in which the plurality of metal wiring layers are laminated as described above. In addition, the seal ring 14 is a loop-shaped structure which is also called a guard ring, is disposed to surround the outside of the chip formation region 10, and has the same laminated structure as the chip formation region 10. The seal ring 14 is provided outside the chip formation region 10 for protecting the semiconductor integrated circuit 1 at the time of dicing a wafer and for preventing a poor reliability due to entering of moisture from a chip cross-section after the dicing.

Further, in order to achieve the above-described aim, the seal ring 14 is formed of metal wiring corresponding to all the metal wiring layers that are used in the circuit of the chip formation region 10, and a wall of a via 16 (a connection region electrically connecting lower metal wiring and upper metal wiring in a multilayer wiring structure) is provided between the layers.

As illustrated in FIGS. 1(b) and 1(c), a voltage application region 13 is implemented by providing an opening H in a passivation film 18. The passivation film 18 is a film provided on an entire surface of a chip for preventing contamination due to moisture or metal ion from the outside. In addition, the passivation film 18 is provided with the opening H for applying a voltage by probing. The voltage is applied to a metal wiring layer M6 through the opening H.

The via 16 is formed between the metal wiring layers adjacent to each other among the plurality of the metal wiring layers. That is, the metal wiring layers are connected through the via 16.

FIG. 1D illustrates a view of the E and F side surfaces in a case where the number of the metal wiring layers are six, as an example. M1 is a first metal wiring layer, and similarly, M2 to M6 are a second to sixth metal wiring layers. In the present embodiment, a case where the total number of metal wiring layers are six is described, but the total number of metal wiring layers is not limited to this. In addition, an interlayer insulating film 15 is formed between the metal wiring layers adjacent to each other.

Note that, each metal wiring layer of the seal ring 14 and each metal wiring layer in the circuit of the chip formation region 10 are electrically insulated, and the voltage applied to each metal wiring layer of the seal ring 14 is not applied to the wiring or a transistor in the chip formation region 10 at the time of performing the interlayer withstand voltage test.

In the present embodiment, the voltage application region 13 and the voltage applying pad 11 form withstand voltage measuring wiring lines insulated from each other and different from each other by connecting the seal ring 14 and a relay region through the via 16. The withstand voltage measuring wiring lines different from each other can apply a voltage between the seal rings 14 that are insulated and provided on the wiring layers adjacent to each other by applying a voltage between the voltage application region 13 and the voltage applying pad 11.

In the present embodiment, the seal ring is formed with metal wiring having a large width (W) and, although there is an exception that is positioned farthest from a substrate 20 and the like, a relay region is formed basically on the same wiring layer as the seal ring with metal wiring having a small width (N).

The seal ring and the relay region are alternately disposed on upper and lower wiring layers as illustrated in FIG. 1C.

The metal wiring forming the seal ring is always installed to surround the outside of the chip formation region 10. The width (W) of the metal wiring forming the seal ring is a dimension so that the metal remains on the chip cross-section after the dicing even when the seal ring and the relay region are alternately disposed as described above. For this reason, the outer periphery is covered with the metal wiring forming the seal ring, such that a waterproof function is maintained by the seal ring.

Figure 5A:
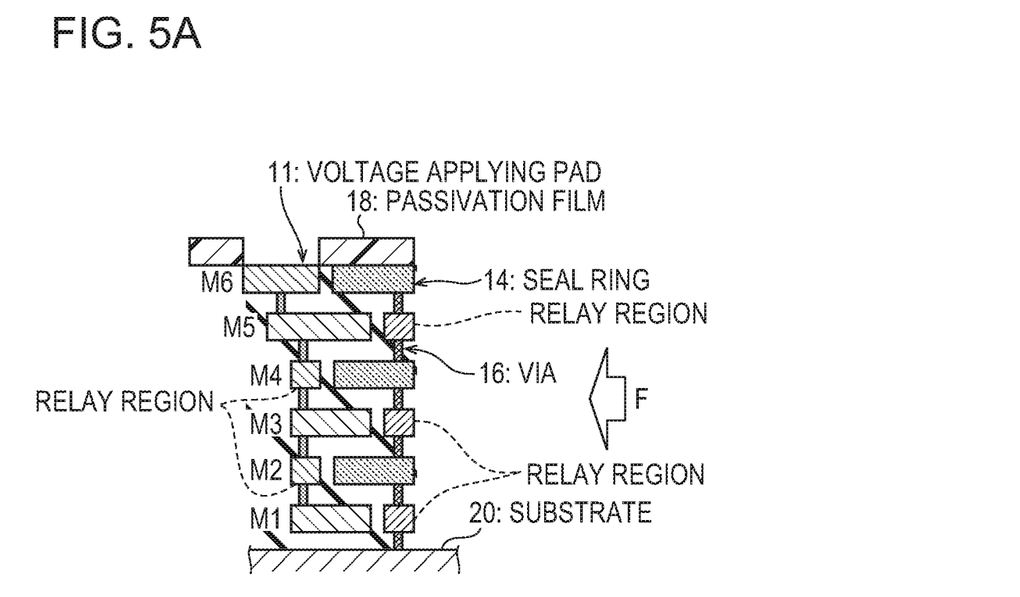
FIG. 5A and FIG. 5B are a side view of the semiconductor integrated circuit in a case where a specific wiring layer has a waterproof function.
Figure 5B:
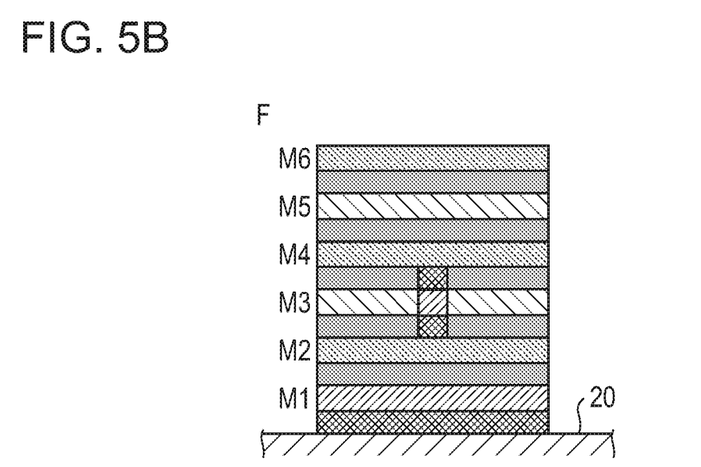

Note that the relay region does not always need to surround an outer periphery of the chip formation region 10. FIG. 5A illustrates the semiconductor integrated circuit 1 in which only the relay region of a metal wiring region M3 does not surround the outside of the chip formation region 10. FIG. 5A is a cross-sectional view taken from line B-B of FIG. 1A. FIG. 5B is a side view illustrating an F side of the semiconductor integrated circuit 1 in FIG. 5A.

As illustrated in FIG. 5A and FIG. 5B, the relay region of the metal wiring region M3 does not surround the outer periphery of the chip formation region 10. The relay region is formed so that only a part of the relay region connects the upper and lower metal wiring layers. Meanwhile, the seal ring 14 formed toward the chip formation region 10 in relation to the relay region of the metal wiring region M3 is formed to surround the outer periphery of the chip formation region 10.

When the relay region does not surround the outer periphery of the chip formation region 10 as seen in the metal wiring layer M3, the relay regions of the metal wiring layer M2 (corresponding to the metal wiring layer below the metal wiring layer M3) and the metal wiring layer M4 (corresponding to the metal wiring layer above the metal wiring layer M3) need to be formed to surround the outer periphery of the chip formation region 10. In the above configuration, the via 16 formed acts as a wall between the metal wiring layers M2 and M3 and between the metal wiring layers M3 and M4. That is how a waterproof function is maintained for the semiconductor integrated circuit 1.

Further, in the present embodiment, a first withstand voltage measuring wiring line connected to the withstand voltage measured place (voltage application region 13) illustrated in FIGS. 1(a) and 1(b) is formed, and a second withstand voltage measuring wiring line connected to the voltage applying pad 11 illustrated in FIGS. 1(a) and 1(c) is formed by connecting the metal wiring of the seal ring and the metal wiring of the relay region described above.

The voltage application region 13 and the voltage applying pad 11 are implemented by providing the opening H in the passivation film 18. The passivation film 18 is a film provided on the entire surface of the chip for preventing contamination due to moisture or metal ion from the outside.

The opening H is formed by removing the passivation film 18. The voltage is applied to the metal wiring layer M6 through the opening H.

The voltage application region 13 and the voltage applying pad 11 may form a pad, but only an opening is formed in the present embodiment in order to reduce a pad formation region.

The first withstand voltage measuring wiring line is formed by connecting, through the via 16, the opening H provided in the metal wiring of the metal wiring layer M6, the relay region of the metal wiring layer M5, the seal ring of the metal wiring layer M4, the relay region of the metal wiring layer M3, the seal ring of the metal wiring layer M2, the relay region of the metal wiring layer M1, and the substrate 20.

The second withstand voltage measuring wiring line is formed by connecting, through the via 16, the voltage applying pad 11 provided in the metal wiring of the metal wiring layer M6, the seal ring of the metal wiring layer M5, the relay region of the metal wiring layer M4, the seal ring of the metal wiring layer M3, the relay region of the metal wiring layer M2, and the seal ring of the metal wiring layer M1.

The second withstand voltage measuring wiring line is formed between the first withstand voltage measuring wiring line and the chip formation region 10, and is insulated by a space S that is provided between the seal ring and the relay region.

The seal ring 14 is formed of the metal wiring layer corresponding to each of all the metal wiring layers used in the circuit of the chip formation region 10 as described above, and thus it is possible to perform a withstand voltage test between all the metal wiring layers by the voltage applying pad 11 and the voltage application region 13.

In the present embodiment, the interlayer withstand voltage test can perform inspection between all the metal wiring layers in the semiconductor integrated circuit 1 at once.

Since the seal ring 14 and the relay region has different potentials at the time of performing the withstand voltage test, the space S for insulation is required. In order to perform the interlayer withstand voltage test, a region in which upper and lower layers are overlapped is required as indicated by an arrow part in FIG. 1C. The overlapped region can be achieved by, as described above, the metal wiring of the seal ring with a larger width than that of the metal wiring of the relay region, and by alternately disposing the seal ring and the relay region between the wiring layers. In order to measure the interlayer withstand voltage, the space S is required to have a distance sufficiently larger than a distance between the layers.

Figure 2:
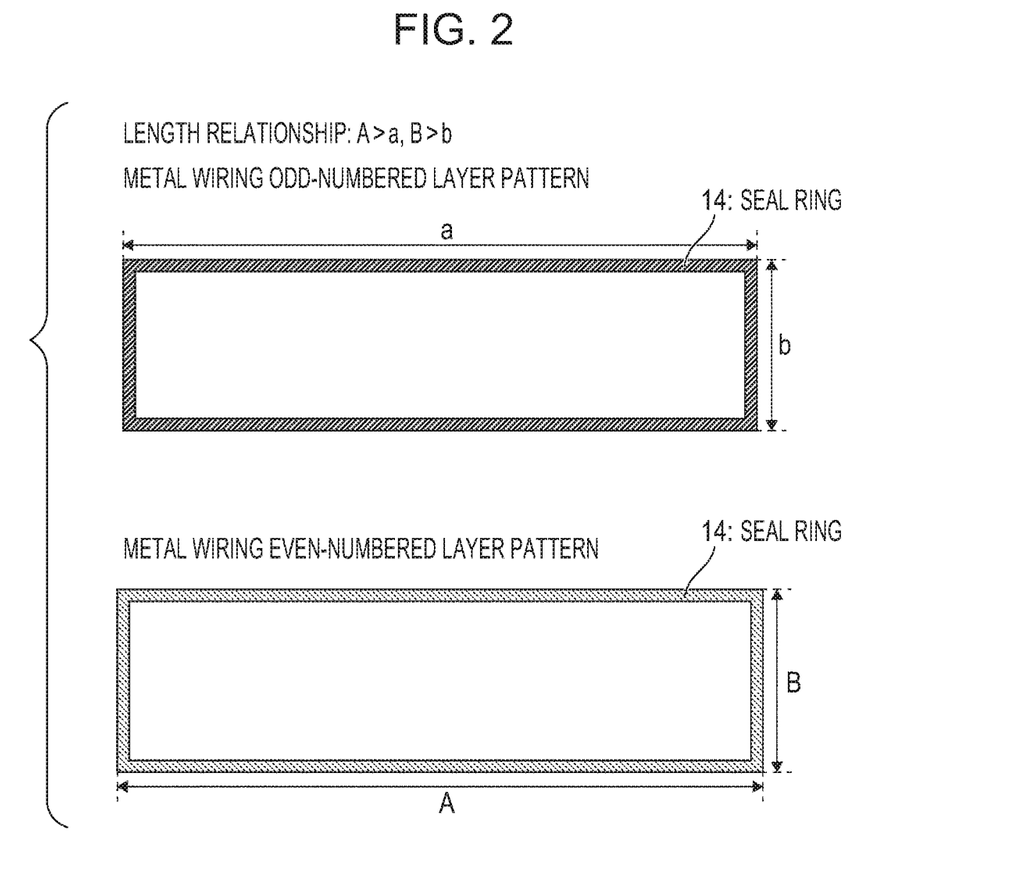
FIG. 2 is a top view illustrating a structure of a seal ring included in the semiconductor integrated circuit.

FIG. 2 is a view illustrating a relationship in external size of the seal ring 14. In an example of FIG. 2, a long side in an external shape of odd-numbered layers (M1, M3, and M5) is denoted as a and a short side thereof is denoted as b, a long side in an external shape of even-numbered layers (M2, M4, and M6) is denoted as A, and a short side thereof is denoted as B, and a relationship of A>a and B>b is satisfied. For clarity, assuming the above-described expression, a width of the seal ring 14 is denoted as W for all layers, a width required as the relay region is denoted as N for all layers, and a space required for insulation is denoted as S for all layers. Specifically, A=a+(N+S) and B=b+(N+S) are satisfied.

Note that, a relationship between the odd-numbered layer and the even-numbered layer may be interchanged. Although the voltage applying pad 11 is required to be disposed inside the seal ring 14 as illustrated in FIGS. 1(a)

and 1(c), voltage applying pad 11 is provided in a dead space in the chip formation region 10, such that an increase in area of the semiconductor integrated circuit 1 can be suppressed.

<Withstand Voltage Test Method>

Next, an interlayer withstand voltage test method will be described. First, a voltage is applied to the voltage applying pad 11 and the voltage application region 13. The applied voltage is set to a value (V_est) which can achieve, for example, a 10-year life guarantee, with reference to the maximum potential difference between metal wiring layers which can be generated during operation or standby in the circuit of the chip formation region 10. Note that, the set value is limited to a range that does not exceed an allowable potential difference in a process specification. The voltage application region 13 has the same potential as the seal ring disposed on the metal wiring layers M2, M4, and M6, (is electrically connected through the via 16 and the relay region) as illustrated in FIG. 1B. On the other hand, the voltage applying pad 11 has the same potential as the seal ring disposed on the metal wiring layers M1, M3, and M5, as illustrated in FIG. 1C. Therefore, the potential difference of V_est is generated at the same time when M(x)−M(x+1) (x=1 to 5). The V_est is a value of, for example, about 40 V.

The substrate 20 is common to the entire surface regardless of the region in the seal ring 14 and the chip formation region 10. In addition, the substrate 20 is described as a P-type substrate in the present specification. In order to make a PN junction between a diffusion region (source/drain) of a MOS transistor formed on the P-type substrate in the chip formation region 10 and the substrate 20 in a reverse bias state, it is required to fix the substrate 20 to the lowest potential in the chip. In the present embodiment, the substrate 20 is fixed to a GND level as an example. Therefore, wiring which has the same potential as the substrate 20 is fixed to the GND level, and the other side (voltage applying pad 11) is applied with a voltage for the withstand voltage test.

Next, a leak current flowing between the voltage applying pad 11 and the voltage application region 13 is measured. A known method is used as a measuring method of the leak current. For example, when the semiconductor integrated circuit 1 is normal, the leak current flowing between the voltage applying pad 11 and the voltage application region 13 is on the order of, for example, picoampere (pA). On the other hand, if an excessive current flows, the semiconductor integrated circuit 1 is determined as a defective product and excluded from a shipping product (performs screening).

Embodiment 2

Hereinafter, a structure of a semiconductor integrated circuit 2 according to Embodiment 2 of the present invention will be described. As in Embodiment 1, the semiconductor integrated circuit 2 has a laminated structure in which a plurality of metal wiring layers (wiring layers) are laminated. Although an interlayer film thickness of each layer may vary depending on the semiconductor integrated circuit, the semiconductor integrated circuit 2 in the present embodiment further includes a second voltage applying pad (voltage applying pad 12), in which a thickness of the interlayer insulating film to which a voltage is applied through a withstand voltage measuring wiring line connected to the voltage applying pad 11 and a withstand voltage measuring wiring line connected to the voltage application region 13, and which is formed between the insulated seal rings provided on the wiring layers adjacent to each other, and a thickness of the interlayer insulating film to which the voltage is applied through a withstand voltage measuring wiring line connected to the voltage applying pad 12 and the withstand voltage measuring wiring line connected to the voltage application region 13, and which is formed between the insulated seal rings provided on the wiring layers adjacent to each other are different from each other.

In such a case, when inspection on the interlayer insulating film is performed by the method of Embodiment 1, it is not easy to apply a voltage suitable for the film thickness in all layers.

For example, it is assumed that there is a relationship of T12<T23, which is between a film thickness (T12) between metal wiring layers M1 and M2 and a film thickness (T23) between metal wiring layers M2 and M3. When a material of the interlayer insulating film is the same, an interlayer withstand voltage in the process specification between the metal wiring layers M1 and M2 is generally smaller than that between the metal wiring layers M2 and M3.

Accordingly, when the voltage is applied in consideration of only the film thickness between the metal wiring layers M2 and M3, if the voltage is a voltage which exceeds the interlayer withstand voltage due to the film thickness between the metal wiring layers M1 and M2, dielectric breakdown may occur and it is determined to be defective even if the film thickness between the metal wiring layers M1 and M2 is normal. On the contrary, when the voltage is applied in consideration of only the film thickness between the metal wiring layers M1 and M2, it is an insufficient applied voltage with respect to the film thickness between the metal wiring layers M2 and M3 in the withstand voltage test, and thus it may not be determined to be defective in the withstand voltage test even if the film thickness between the metal wiring layers M2 and M3 is smaller than assumed.

Therefore, in the semiconductor integrated circuit 2 of which the interlayer insulating film thicknesses of respective layers are different, the semiconductor integrated circuit 2 capable of applying the voltage suitable for the film thickness of each layer is achieved in the present embodiment. Hereinafter, the description of the structure as in Embodiment 1 and the like will be omitted.

As an example, FIGS. 3A to 3E illustrates a top view in a case where the withstand voltage test is performed individually on the metal wiring layers M1 to M4 and the metal wiring layers M4 to M6. The voltage application region 13 and the voltage applying pads 11 and 12 are disposed at three places illustrated in FIGS. 3A to 3E.

Figure 3A:
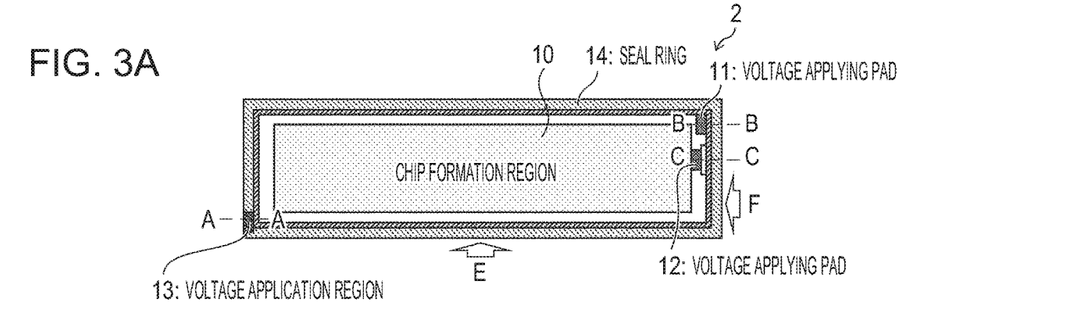
FIG. 3A is a top view of a semiconductor integrated circuit according to Embodiment 2 of the present invention.
Figure 3B:
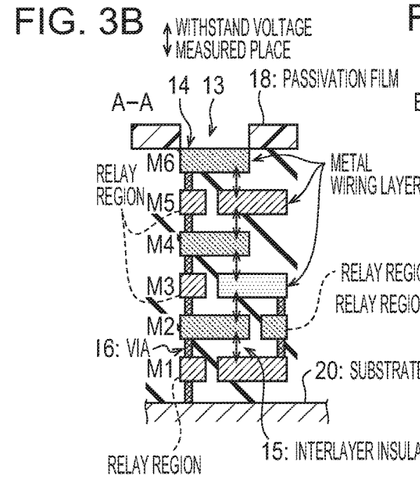
FIG. 3B is a sectional view taken along line A-A of the semiconductor integrated circuit.
Figures 3C, 3D:
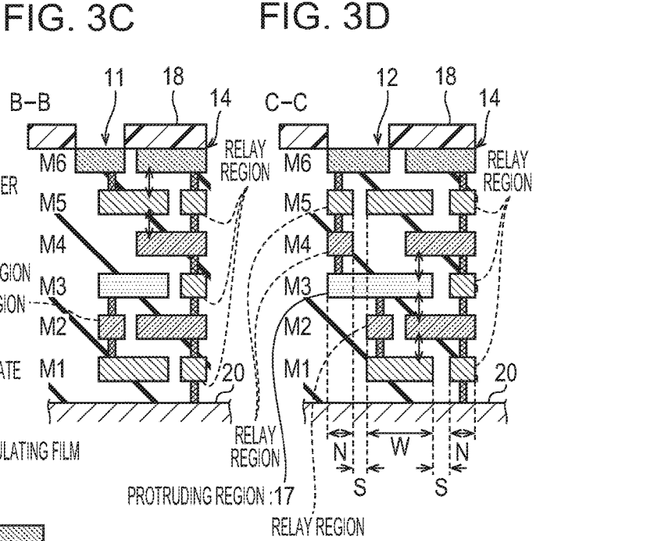
FIG. 3C is a sectional view taken along line B-B of the semiconductor integrated circuit.
FIG. 3D is a sectional view taken along line C-C of the semiconductor integrated circuit.
Figure 3E:
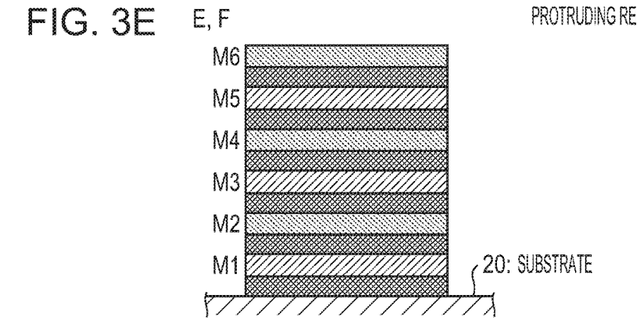
FIG. 3E is a view of E and F side surfaces of the semiconductor integrated circuit.

Further, FIGS. 3B to 3D are sectional views taken along line A-A, B-B, and C-C in FIG. 3A, respectively. Each of the voltage application region 13 and the voltage applying pads 11 and 12 is provided on a metal wiring layer (M6) which is positioned farthest from a substrate 20 and on which a chip formation region 10 and a seal ring 14 is formed on a surface thereof, among a plurality of metal wiring layers (M1 to M6).

The voltage applying pad 11 has the same potential as (the seal ring of) the metal wiring layer M5 (is electrically connected through a via 16). In addition, the voltage applying pad 12 has the same potential as (the seal ring of) the metal wiring layers M1 and M3, and furthermore, the voltage application region 13 has the same potential as (the seal ring of) the metal wiring layers M2, M4, and M6.

Figure 4:
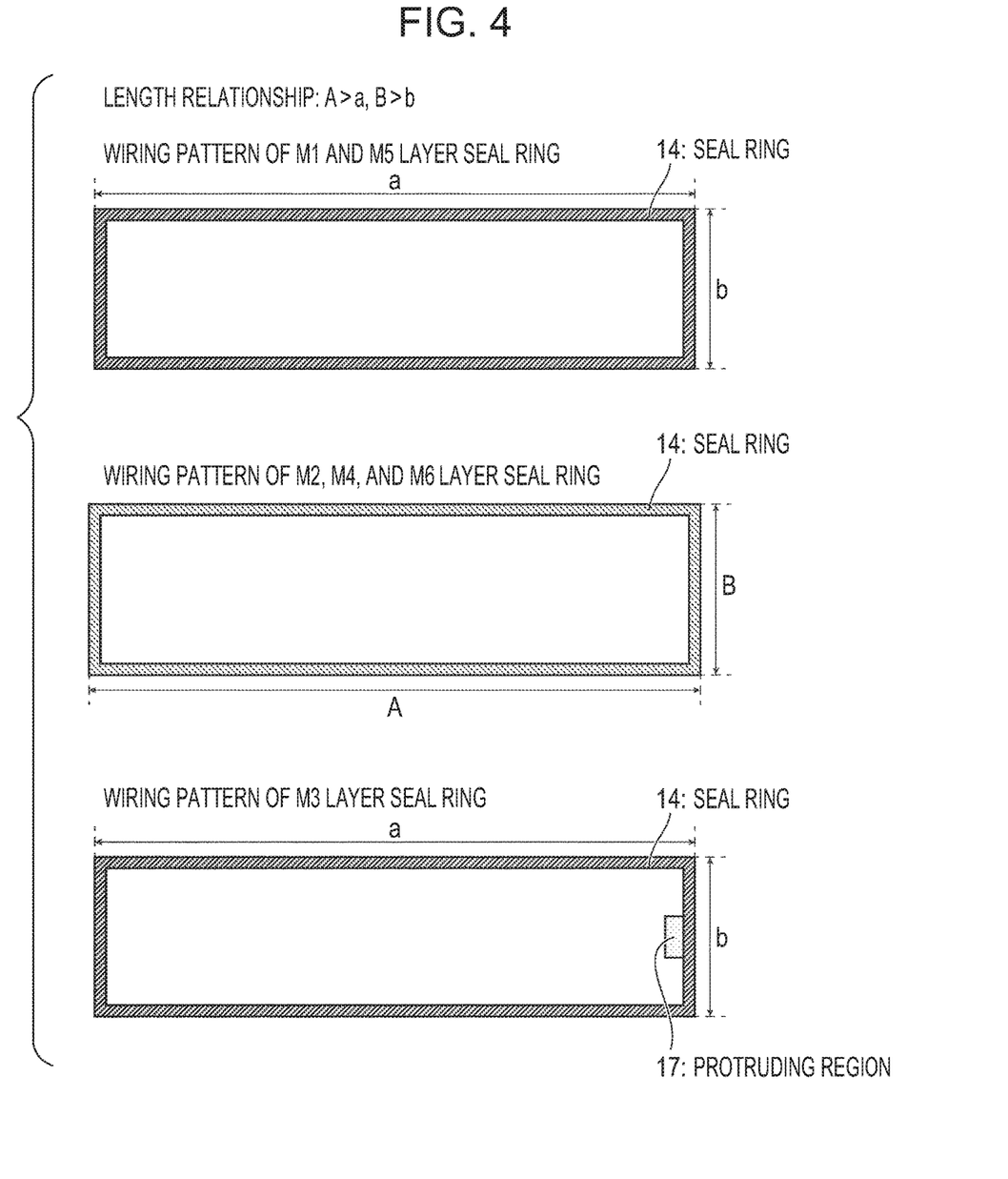
FIG. 4 is a top view illustrating a structure of the seal ring included in the semiconductor integrated circuit.

FIG. 4 is a view illustrating an external size of the seal ring 14 in Embodiment 2. Relational expressions between a and b and A and B indicating lengths of a long side and a short side, respectively, are as described above. In Embodiment 2, a protruding region 17 having a width of S+N is present in the metal wiring layer M3 as a region for providing the voltage applying pad 12 (a long side of the protruding region 17 may be an any length required for installing the via 16). Note that, the protruding region 17 and the seal ring 14 are formed of the same material. In the present embodiment, the seal ring or a relay region formed on a specific metal wiring layer among the plurality of metal wiring layers has a protruding region protruding toward the chip formation region 10 as compared with a seal ring or a relay region formed on another metal wiring layer.

Note that, the protruding region 17 is a region protruding toward the chip formation region 10 in a specific metal wiring layer (M3) among the plurality of the metal wiring layers, as compared to other metal wiring layers.

In order to secure a wide wiring region of the chip formation region 10, the protruding region 17 is configured to be provided in the metal wiring layer M3 in the above-described example, but the protruding region 17 does not necessarily have a protruding shape, and may have a structure in which an outer periphery thereof is surrounded by wiring with a wide width of "W+S+N". However, since the seal ring 14 is provided as a dead space, the protruding region 17 in the metal wiring layer M3 illustrated in FIG. 4 has a protruding shape in order to secure a wide wiring region of the chip formation region 10 (in order to make the dead space as small as possible). In an example of FIG. 4, a region other than the protruding region 17 in the metal wiring layer M3 of the chip formation region 10 can be widely secured toward the outside (the seal ring 14) by "S+N".

Note that, the required number of voltage applying pads are as described above. In addition, a constituent material of the voltage applying pad may be a conductive material such as copper, aluminum, or the like. Note that, the constituent material of the voltage applying pad may be selected according to the process to be used.

<Withstand Voltage Test Method>

Hereinafter, a withstand voltage test method according to the present embodiment will be described. In the present embodiment, a film thickness (T45) between the metal wiring layers M4 and M5 and a film thickness (T56) between the metal wiring layers M5 and M6 are equal to each other (T45=T56). In addition, the film thickness (T12) between the metal wiring layers M1 and M2, the film thickness (T23) between the metal wiring layers M2 and M3, and a film thickness (T34) between the metal wiring layers M3 and M4 are equal to each other (T12=T23=T34).

Furthermore, there is a relationship of T45=T56>T12=T23=T34 (Equation 1). A case of performing the withstand voltage test twice will be described in the following example.

First, in order to perform the withstand voltage test on the first to fourth metal wiring layers (M1 to M4), a voltage is applied to the voltage applying pad 12 and the voltage application region 13. The voltage application region 13 has the same potential as the substrate 20, and is thus fixed to a GND level, as described above.

A potential difference (V23) between the voltage applying pad 12 and the voltage application region 13 is set so as not to exceed a withstand voltage between the first to fourth metal wiring layers (M1 to M4) in the process specification of the film thicknesses (T12, T23, and T34). For example, a voltage of 40 V is applied to the voltage applying pad 12 and a voltage of 0 V is applied to the voltage application region 13. After applying the voltage, a leak current flowing between the voltage applying pad 12 and the voltage application region 13 is measured.

Next, in order to perform the withstand voltage test on the fourth to sixth metal wiring layers (M4 to M6) in the same order, a voltage is applied to the voltage applying pad 11 and the voltage application region 13. A potential difference (V13) between the voltage applying pad 11 and the voltage application region 13 is set so as not to exceed a withstand voltage between the fourth to sixth metal wiring layers (M4 to M6) in the process specification of the film thicknesses (T45 and T56). For example, a voltage of 50 V is applied to the voltage applying pad 11 and a voltage of 0 V is applied to the voltage application region 13.

Because of the relationship of Equation 1, V13>V23 is satisfied. After applying the voltage, a leak current flowing between the voltage applying pad 11 and the voltage application region 13 is measured. With the method of Embodiment 2 as described above, the withstand voltage test on two different types of potential difference can be performed. In Embodiment 2, voltages of 50 V, 40 V, and 0 V are simultaneously applied to the voltage applying pad 11, the voltage applying pad 12, and the voltage application region 13, respectively, such that it is possible to simultaneously perform the withstand voltage test on the different two kinds of potential difference.

Similarly, when the withstand voltage test is performed N times, N voltage applying pads and one voltage application region may be provided in the seal ring 14. Even when the interlayer withstand voltages for each interlayer film are different from the above-described configuration, a voltage suitable for each interlayer film can be applied. In addition, since the seal ring 14 is provided over a wide range so as to surround the outside of the chip formation region 10 as described above, it is possible to perform the interlayer withstand voltage test in consideration of variations in thickness of interlayer film of the entire semiconductor integrated circuit 2 which has a multilayer wiring structure by providing the voltage applying pad in the seal ring 14 and performing the withstand voltage test. Accordingly, the semiconductor integrated circuit 2 having a structure that is suitable for the withstand voltage test on an interlayer insulating film can be achieved.

[Another Expression of Embodiment of Present Invention]

An embodiment of the present invention can also be expressed as follows. That is, according to an embodiment of the present invention, a semiconductor integrated circuit formed of a plurality of wiring layers and including a circuit region, the semiconductor integrated circuit has a configuration including: a conductive seal ring surrounding an outside of the circuit region and provided with the wiring layer; a via wall electrically connecting the wiring layer and a wiring layer adjacent to the wiring layer in a laminating direction; a first interlayer insulating film provided between the wiring layer and the wiring layer adjacent to the wiring layer in the laminating direction; a voltage application region provided on a top face of the seal ring provided on a top face of the semiconductor integrated circuit; and a voltage applying pad provided on the top face of the semiconductor integrated circuit.

The semiconductor integrated circuit according to an embodiment of the present invention includes a second interlayer insulating film between the wiring layer and a wiring layer adjacent to the wiring layer, the second interlayer insulating film having a thickness different from that of the first interlayer insulating film.

A withstand voltage test method according to an embodiment of the present invention is a withstand voltage test of the semiconductor integrated circuit including a first interlayer insulating film between multilayer wiring lines and a circuit region, the withstand voltage test method is a method of: applying a voltage between a voltage application region and a voltage applying pad, the voltage application region provided on a top face of a seal ring provided on a top face of the semiconductor integrated circuit among seal rings of a conductive layer surrounding an outside of the circuit region and provided with the wiring layer and the voltage applying pad provided on the top face of the semiconductor integrated circuit, and then measuring a leak current flowing in the first interlayer insulating film.

In the withstand voltage test method according to an embodiment of the present invention, the semiconductor integrated circuit includes a second interlayer insulating film having a thickness different from that of the first interlayer insulating film, and the withstand voltage test method is a method of: measuring the leak current flowing in the first interlayer insulating film; applying different voltages to the voltage application region and a voltage applying pad different from the voltage applying pad; and measuring a leak current flowing in the second interlayer insulating film.

[Appendix]

The present invention is not limited to the description of the embodiments above, but may be altered in various ways by a skilled person within the scope of the claims. Any embodiment based on a proper combination of technical means disclosed in different embodiments is also encompassed in the technical scope of the present invention. Further, combining technical means disclosed in different embodiments can provide a new technical feature.

REFERENCE SIGNS LIST 1, 2 semiconductor integrated circuit
10 chip formation region
11, 12 voltage applying pad
13 voltage application region
14 seal ring
15 interlayer insulating film
16 via
17 protruding region
18 passivation film
H opening
M1 to M6 metal wiring layer (wiring layer)

What is claimed is:

1. A semiconductor integrated circuit comprising:
a chip formation region having a laminated structure in which a plurality of wiring layers are laminated;
a plurality of seal rings disposed to surround an outside of the chip formation region, having an identical laminated structure with the chip formation region, and formed of metal wiring;
a plurality of relay regions disposed at the outside of the chip formation region, having an identical laminated structure with the chip formation region, and formed of metal wiring;
a plurality of vias formed between the wiring layers adjacent to each other; and
a voltage application region and a voltage applying pad provided on a wiring layer which is positioned farthest from a substrate and on which the chip formation region and one of the seal rings are formed, among the plurality of wiring layers,
wherein the voltage application region and the voltage applying pad form withstand voltage measuring wiring lines insulated from each other and different from each other by connecting one of the seal rings and one of the relay regions through one of the vias, and
the withstand voltage measuring wiring lines different from each other are configured to apply a voltage between insulated seal rings provided on the wiring layers adjacent to each other by applying a voltage between the voltage application region and the voltage applying pad.

2. The semiconductor integrated circuit according to claim 1, further comprising:
a second voltage applying pad,
wherein a thickness of an interlayer insulating film to which a voltage is applied through a withstand voltage measuring wiring line connected to the voltage applying pad and a withstand voltage measuring wiring line connected to the voltage application region, and which is formed between insulated seal rings provided on the wiring layers adjacent to each other, and a thickness of an interlayer insulating film to which a voltage is applied through a withstand voltage measuring wiring line connected to the second voltage applying pad and the withstand voltage measuring wiring line connected to the voltage application region, and which is formed between insulated seal rings provided on the wiring layers adjacent to each other are different from each other.

3. The semiconductor integrated circuit according to claim 1,
wherein a seal ring or a relay region formed on a specific wiring layer among the plurality of wiring layers has a protruding region protruding toward the chip formation region as compared with a seal ring or a relay region formed on another wiring layer.

4. A withstand voltage test method in the semiconductor integrated circuit of claim 1, comprising:
applying a voltage between the voltage application region and the voltage applying pad, and then measuring a leak current flowing between the voltage application region and the voltage applying pad.

5. A withstand voltage test method in the semiconductor integrated circuit in claim 2, comprising:
applying a voltage between the voltage application region and the voltage applying pad, and then measuring a leak current flowing between the voltage application region and the voltage applying pad; and
applying a voltage between the voltage application region and the second voltage applying pad, and then measuring a leak current flowing between the voltage application region and the second voltage applying pad.

* * * * *